United States Patent [19]

Maddox

[11] 3,886,486

[45] May 27, 1975

[54] OSCILLATOR CIRCUIT FOR GENERATING AN OUTPUT SIGNAL HAVING SUCCESSIVE CYCLES WHICH UNIDIRECTIONALLY VARY IN FREQUENCY

[75] Inventor: Harry L. Maddox, Reynoldsburg, Ohio

[73] Assignee: Western Electric Company, Incorporated, New York, N.Y.

[22] Filed: Apr. 15, 1974

[21] Appl. No.: 461,082

[52] U.S. Cl. .................................. 331/111; 331/178

[51] Int. Cl. ............................................. H03k 3/28

[58] Field of Search ......... 331/111, 177 R, 178, 179

[56] References Cited

UNITED STATES PATENTS

| | | | |
|---|---|---|---|
| 3,225,310 | 12/1965 | Stratton et al. | 331/111 |
| 3,460,136 | 8/1969 | Jambazian | 331/111 X |
| 3,740,667 | 6/1973 | Reuter | 331/111 |

*Primary Examiner*—Siegfried H. Grimm

*Attorney, Agent, or Firm*—R. A. Lloyd

[57] ABSTRACT

An oscillator is arranged to generate cycles of an output signal which have a frequency in accordance with the potential across a first capacitor of the oscillator. To increase the frequency of successive cycles of the output signal, a quantum of energy is transferred from a second capacitor, having a small capacitance value with respect to the capacitance value of the first capacitor, to the first capacitor after each cycle of the signal from the oscillator. This successively, with each cycle of the output signal, increases the potential across the first capacitor, so that the succeeding cycle of the signal has a greater frequency than that of the cycle which preceded it.

20 Claims, 2 Drawing Figures

OSCILLATOR CIRCUIT FOR GENERATING AN OUTPUT SIGNAL HAVING SUCCESSIVE CYCLES WHICH UNIDIRECTIONALLY VARY IN FREQUENCY

BACKGROUND OF THE INVENTION

1. Field of the Invention

The present invention relates to oscillator circuits, and in particular to an oscillator circuit wherein the potential across a capacitor thereof is incrementally increased after each cycle of an output signal therefrom, and wherein the cycles of the output signal have a frequency which is in accordance with the potential across the capacitor.

2. Description of the Prior Art

Oscillator circuits having variable and controlled frequency outputs, such as voltage controlled oscillators or sweep oscillators, are extensively used in the electronics art. Voltage controlled oscillators, for example, the output signals of which have a frequency which is in accordance with, and which is controlled by, the potential of an input signal applied thereto, find use in the generation of pulses, or signals, of varying frequency. With the voltage controlled oscillator some source of input potential means, external of the oscillator, must be provided for applying the controlled potential input thereto.

Sweep oscillators provide a series of pulses in which the pulse repetition frequency varies at a predetermined rate to sweep through a desired band of pulse frequencies, and find application, by way of example, in receivers arranged for surveillance of a frequency band. In a common embodiment, the sweep oscillator is comprised of the combination of a voltage ramp generator and a voltage controlled oscillator, and the voltage ramp generator is arranged to provide an input, which varies in potential as a function of time, to the voltage controlled oscillator for generating at the output thereof a signal which varies in frequency as a function of time.

One disadvantage of both the voltage controlled oscillator and the sweep oscillator is that each requires external circuitry for applying to an input thereof a controlled potential, whether the potential varies with respect to time or is constant with respect to time, for controlling the frequency of the output signal therefrom. Another disadvantage of both the voltage controlled oscillator and the sweep oscillator is that they are capable of operating only within a limited frequency band, or range. In conventionally designed oscillators, the frequency of the output signal is determined by the time required for a capacitor, charged through a first transistor the conduction of which is in accordance with the input potential to the circuit, to charge from a first potential to a second potential which is sufficient to trigger into conduction a pair of transistors connected in a regenerative arrangement for rapidly discharging the capacitor to its first potential. With this oscillator design, the upper frequency is determined by the state of conduction of the first transistor at which sufficient current is provided to the capacitor and to the pair of transistors, during the discharge of the capacitor, to maintain the pair of transistors conductive and to prevent the capacitor from being discharged from the second potential to the first potential.

SUMMARY OF THE INVENTION

In accordance with the present invention, an oscillator circuit, for generating an output signal which has a frequency in accordance with the value of a control voltage, includes a capacitor for cyclically receiving a charge and for generating the output signal across the plates thereof, and a first semiconductor device having a conductivity in accordance with the value of the control voltage for charging the capacitor at a rate which is directly in accordance with the conductivity thereof. Also included is a second semicor luctor device, controlled by the accumulated charge on the capacitor to be rendered conductive when the accumulated charge is at a first level to discharge the capacitor to a second level of charge, and to be rendered nonconductive when the capacitor has discharged to the second level of charge, to cyclically generate across the capacitor successive cycles of the output signal which have a frequency in accordance with the rate at which the first semiconductor device charges the capacitor from the second level of charge to the first level of charge. Further included is a third semiconductor device for rendering the first semiconductor device nonconductive upon conduction of the second semiconductor device and for rendering the first semiconductor device conductive upon nonconduction of the second semiconductor device.

Preferably, the oscillator circuit generates an output signal the successive cycles of which increase in frequency, the first and second semiconductive devices are first and second transistors, respectively, having their emitter-collector circuits connected in series, and a first capacitor, across the plates of which the output signal is generated, is connected to the juncture between the first and the second transistors for cyclically being charged by the first transistor and discharged by the second transistor. The oscillator circuit also includes a second capacitor, for accumulating a charge on the plates thereof and having a potential across the plates in accordance with the charge accumulated thereon, as well as circuitry for applying a potential to the base of the first transistor, which is in accordance with the potential across the plates of the second capacitor, to control the conductivity of the first transistor to charge the first capacitor from a first value of charge to a second value of charge at a rate which is in accordance with the conductivity thereof. Circuitry, for controlling the potential at the base of the second transistor, maintains the second transistor nonconductive while the first capacitor is charging from the first to the second level of charge, renders the second transistor conductive when the first capacitor is at the second level of charge to discharge the first capacitor toward the first level of charge, and renders the second transistor nonconductive when the first capacitor has discharged to the first level of charge so that the first transistor again charges the first capacitor from the first to the second levels of charge.

Further included in the oscillator circuit is a third capacitor, having first and second plates, for receiving and accumulating a charge on the first plate thereof while the first capacitor is charged from the first to the second value of charge, and a third transistor, which is rendered conductive upon conduction of the second transistor and nonconductive upon nonconduction of the second transistor, connected to the first plate of the third capacitor for rapidly changing the charge thereon, and therefore the potential thereof, upon conduction thereof, so that the potential transition on the first plate of the third capacitor is capacitively coupled to the second plate thereof. Circuitry is included for applying the potential transition on the second plate of the third capacitor to the second capacitor for changing the charge on the plates thereof, and therefore the potential across the plates thereof, whereby the potential at the base of the first transistor is changed. This cyclically and unidirectionally changes the potential at the base of the first transistor to increase the conductivity thereof to charge the first capacitor from the first to the second value of charge at an increased rate.

In one aspect of the invention a plurality of diodes are connected in series to exhibit a common polarity between first and second terminals, and individual ones of a plurality of resistors are connected between a third terminal and an individual one of the junctures between the serially connected diodes, and one of the resistors is connected between the second terminal and the third terminal. This arrangement of resistors and diodes is connected in series with the first transistor to form a series circuit extending from the first capacitor, through the first transistor, and through the resistors and diodes from the first terminal to the third terminal, so that as the first transistor charges the first capacitor at an increasing rate, successive ones of the diodes conduct current through successive ones of the resistors as the forward voltage drop of the diodes is exceeded.

Other advantages and features of the invention will be apparent upon consideration of the following detailed description when taken in conjunction with the appended drawings.

DETAILED DESCRIPTION

Figure 1:
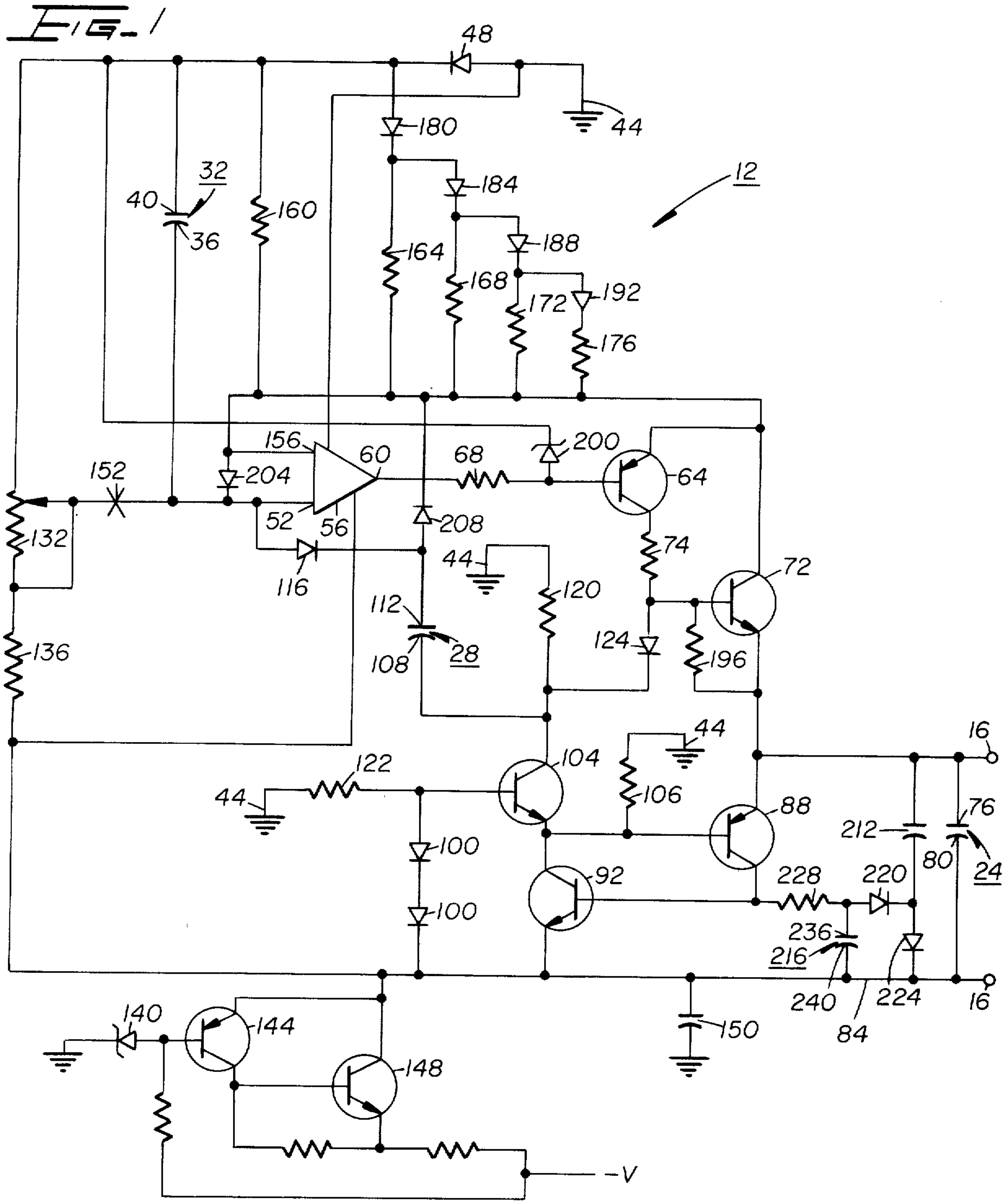
FIG. 1 shows in schematic form circuitry for generating an increasing frequency signal in accordance with the present invention.
Figure 2:
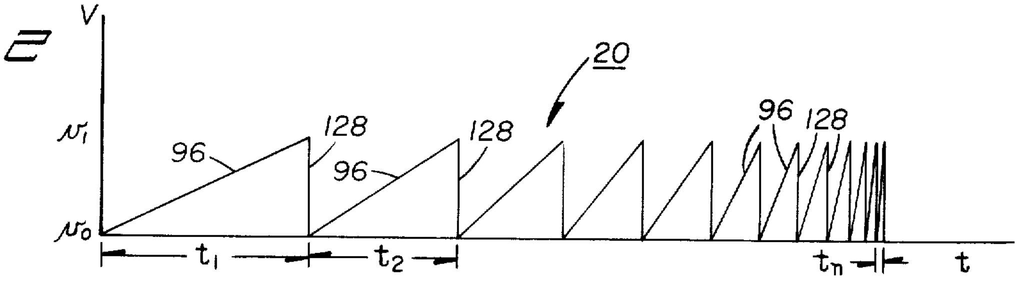
FIG. 2 is a waveform of a signal generated with the circuitry of FIG. 1.

FIG. 1 of the drawings illustrates an oscillator circuit 12 for generating across a pair of output terminals 16 a signal 20, as shown in FIG. 2, the individual cycles of which have a constant voltage excursion, or amplitude from $v_o$ to $v_1$, and the successive cycles of which increase in frequency from an initial first frequency value to a second, constant (not shown) and higher frequency value. In other words, successive cycles of the signal 20 have decreasing periods, and the period $t_N$ of the Nth cycle of the signal 20, where the signal is not yet at the second frequency, is less than the period $t_{N-1}$ of the preceding Nth−1 cycle, and is greater than the period $t_{N+1}$ of the succeeding Nth+1 cycle, of the signal 20.

Essentially, the output signal 20 of the oscillator 12, which is the voltage appearing across the plates of a capacitor 24 connected between the output terminals 16, is increased in frequency with successive cycles of the circuit 12 by transferring a quantum of energy from a capacitor 28, having a relatively small capacitance value, to a capacitor 32, having a relatively large capacitance value, with each cycle of operation of the circuit 12, or with each cycle of the signal 20. The level of energy on the capacitor 32 therefore increases with each cycle of operation of the oscillator 12, and the oscillator 12 is arranged to generate the signal 20, across the terminals 16, having a frequency which is in accordance with the level of energy on the capacitor 32 and which increases directly in accordance therewith.

Generally, this is accomplished by applying the voltage potential on one plate 36 of the capacitor 32, the other plate 40 of which is connected to a ground reference potential 44 through a diode 48, to a noninverting input 52 of an operational amplifier (op amp) 56. The value of the voltage on the plate 36 of the capacitor 32 is in accordance with the energy stored in the capacitor 32, and controls the magnitude of the voltage at an output 60 of the op amp 56 as applied to the base of a PNP transistor 64, through a resistor 68, for controlling the conduction thereof. The transistor 64 is connected with an NPN transistor 72, through a resistor 74 between the collector of the transistor 64 and the base of the transistor 72, for converting a voltage at the base of the transistor 64 to a current at the emitter of the transistor 72, and the magnitude of the current at the emitter of the transistor 72 is controlled by the voltage at the output 60 of the op amp 56, or by the potential on the plate 36 of the capacitor 32. With the transistors 64 and 72 conducting, the current at the emitter of the transistor 72 is applied to one plate 76 of the capacitor 24, the other plate 80 of which is connected to a negative reference potential on a conductor 84. This cyclically charges the plate 76 of the capacitor 24 from a first level of charge to a second level of charge at a rate determined by the current supplied by, or the conductivity of, the transistor 72, and the resulting voltage change across the plates of the capacitor appears across the terminals 16, as shown in FIG. 2, as a ramp portion 96 of the signal 20.

The plate 76 of the capacitor 24 is connected to the emitter of a PNP transistor 88, which is in a regenerative arrangement with an NPN transistor 92. with the transistors 64 and 72 conducting to begin charging the capacitor 24 from an initial state at which the voltage on the plate 76 is $v_o$, the transistor 88, and therefore the transistor 92, is maintained nonconductive as a result of a potential on the base of the transistor 88 which is positive with respect to the potential applied to the emitter thereof from the plate 76 of the capacitor 24. The potential on the base of the transistor 88 is obtained from the conductor 84 through a pair of diodes 100, and through the base emitter junction of a transistor 104 which is conductively reverse biased by current supplied through a resistor 106 to exhibit a Zener diode effect. Simultaneously with the capacitor 24 being charged by current from the emitter of the transistor 72, one plate 108 of the capacitor 28, the other plate 112 of which is connected to the plate 36 of the capacitor 32 through a diode 116, is charged to a ground potential by current applied through a resistor 120 from the source of ground potential 44.

When the potential on the plate 76 of the capacitor 24, applied to the emitter of the transistor 88, increases to a value $v_1$ which is slightly in excess of the potential applied to the base of the transistor 88, the transistor 88 conducts to trigger into conduction the transistor 92, which in turn applies the negative potential on the conductor 84 to both the base of the transistor 88, to maintain the transistor 88 conductive, and to the emitter of the transistor 104. This forward biases the base-emitter junction of the transistor 104, the base of which is connected to the juncture of the pair of diodes 100 and a resistor 122 to ground, to render the transistor 104 conductive. Conduction of the transistor 104 applies the negative potential on the conductor 84 through a diode 124 to the base of the transistor 72 to render the transistor 72 nonconductive, as well as to the plate 108 of the capacitor 28 to discharge the plate 108 toward the negative potential on the conductor 84. The negative going transition on the plate 108 of the capacitor 28 is coupled to the plate 112 thereof, and applied through the diode 116 to the plate 36 of the capacitor 32 to slightly decrease the potential on the plate 36. This is equivalent to the transfer of a quantum of energy from the capacitor 28 to the capacitor 32. Typically, the capacitance value of the capacitor 32 may be 1000 times greater than the capacitance value of the capacitor 28.

Simultaneously with the transfer of a quantum of energy from the capacitor 28 to the capacitor 32, conduction of the transistor 88 rapidly controls the discharge of the plate 76 of the capacitor 24, through both the emitter-collector junction of the transistor 88 and the base-emitter junction of the transistor 92, toward the potential on the conductor 84. The discharge of the plate 76 of the capacitor 24 appears across the pair of terminals 16, as shown in FIG. 2, as a negative going portion 128 of the signal 20.

When the potential on the plate 76 of the capacitor 24, as the plate 76 discharges through the transistors 88 and 92, reaches a potential $v_o$ which, when applied to the emitter of the transistor 88, is insufficient to maintain the transistor 88 in conduction, the transistor 88, and therefore the transistor 92, becomes nonconductive. This in turn renders the transistor 104 nonconductive to enable the transistor 72 to conduct in response to an input at the base thereof from the transistor 64, and to enable the plate 108 of the capacitor 28 to again be charged to the ground potential through the resistor 120.

The described cycle of operation of the oscillator 12 generated across the terminals 16 one cycle of a sawtoothed wave having an amplitude equal to the difference between the potential $v_1$ at the emitter of the transistor 88, when the transistor 88 is in a nonconductive state, required to render the transistor 88 conductive, and the potential $v_o$ at the emitter of the transistor 88, when the transistor 88 is conducting, which is insufficient to maintain the transistor 88 in its conductive state, and having a period equal to the time required for the plate 76 of the capacitor 24 to charge from the potential $v_o$ to the potential $v_1$, and to then discharge to the potential $v_o$. At this point, the circuit 12 is in essentially the same conditions as when a charging current was previously initially applied to the capacitor 24, with the significant difference that the plate 36 of the capacitor 32 now is at a potential which is slightly less positive, or more negative, than was the potential thereof during the previous cycle of the circuit 12. This more negative potential, applied to the input 52 of the op amp 56 provides an increased base drive to the transistor 64 to render the transistor 64 more conductive than it was during the previous cycle, which in turn renders the transistor 72 more conductive than it was during the previous cycle. This in turn increases the current applied from the emitter of the transistor 72 to the plate 76 of the capacitor 24 to provide the potential $v_1$ at the emitter of the transistor 88, which is slightly in excess of the potential at the base thereof, in a shorter period of time than was required during the previous cycle. When the potential at the emitter of the transistor 88 is $v_1$, the operation of the oscillator circuit 12 again proceeds as above described to apply another negative pulse to the plate 36 of the capacitor 32 from the plate 112 of the capacitor 28 so that, during the next succeeding cycle, the transistor 72 will be rendered more conductive yet.

More particularly, in the preferred embodiment of the circuit a variable resistor 132 is connected in series with a resistor 136 between the plate 40 of the capacitor 32 and the negative reference potential on the conductor 84. The negative potential on the conductor 84 is determined by the value of a Zener diode 140 which, with a pair of transistors 144 and 148 and a filter capacitor 150, forms a voltage regulator for applying over the conductor 84 a negative regulated reference potential. The plate 40 of the capacitor 32 is also, as previously described, connected to the ground reference 44 through the diode 48, which, with the potentials as shown, is forward biased to pass a current through the resistors 132 and 136 to the conductor 84.

To initiate operation of the oscillator circuit 12 a normally open switch 152, connected between the juncture of the resistors 132 and 136 and the plate 36 of the capacitor 32, is momentarily closed to apply an initial charge, or potential, to the plate 36 of the capacitor 32 as determined by the setting of the variable resistor 132. Normally, the variable resistor 132 is adjusted so that the initial potential applied to the plate 36 of the capacitor 32 is slightly negative with respect to the potential on the plate 40 thereof. The op amp 56, which receives at its input 52 the potential on the plate 36 of the capacitor 32, receives at an invertingg input 156 thereof the potential at the juncture of the emitter of the transistor 64 with a plurality of resistors 160, 164, 168, 172 and 176 connected in a voltage-stepped arrangement with a plurality of diodes 180, 184, 188 and 192 between the plate 40 of the capacitor 32 and the emitter of the transistor 64. The stepped arrangement of the resistors and diodes is such that as the voltage potential thereacross increases, successive ones of the resistors 164, 168, 172 and 176 conduct current therethrough as the forward voltage drop across successive ones of their associated diodes 180, 184, 188 and 192 is exceeded. As shown, the current flowing through the resistors 160, 164, 168, 172 and 174 is essentially equal to the current from the emitter of the transistor 72 when the transistor 72 conducts, and in the preferred embodiment of the invention the value of the resistors successively decreases from the resistor 160 to the resistor 176 so that, as the output frequency of the circuit 12 increases in response to an increasingly negative potential on the plate 36 of the capacitor 32 which, as will be seen, generates an increasing voltage potential between the cathode of the diode 48 and the emitter of the transistor 64, a nonlinearly increasing current is available for charging the plate 76 of the capacitor 24. The values of the resistors 160, 164, 168, 172 and 176 are chosen to provide, across the output terminals 16, a signal 20 each successive cycle of which increases in frequency by a small and essentially constant fraction of the preceding cycle.

In operation, the potential at the input 52 of the op amp 56 is determined by the potential on the plate 36 of the capacitor 32, and the op amp 52 draws at the output 60 thereof whatever current is required to bring the potential at the input 156 to the potential at the input 52. Therefore, the potential across the voltage-stepped resistors 160, 164, 168, 172 and 176 and diodes 180, 184, 188 and 192 will always be equal to the potential across the plates 36 and 40 of the capacitor 32. This equalization of potential is accomplished by controlling the conduction of the transistor 64 with the output 60 of the op amp 56 through the resistor 68, which in turn controls the conduction of the transistor 72 through the resistor 74 and through a resistor 196 connected between the base and the emitter of the transistor 72. The state of conduction of the transistor 72, while the plate 76 of the capacitor 24 is being charged, determines the current drawn through one or more of the resistors 160, 164, 168, 172 and 176, and, accordingly, the potential at the input 156 of the op amp 56.

When the switch 152 is momentarily closed to initiate operation of the circuit 12, the potential on the plate 36 of the capacitor 32 is normally made to be, as previously stated, slightly negative with respect to the potential on the plate 40 thereof. This potential at the input 52 of the op amp 56 causes the op amp to draw at its output 60 current which is sufficient to drive the transistor 72 to a state of conduction where the current through one or more of the resistors 160, 164, 168, 172 and 176, as applied to charge the plate 76 of the capacitor 24, provides at the input 156 of the op amp 56 a potential which is equal to the potential at the input 52 thereof. If the potential between the plates 36 and 40 of the capacitor 32 is less than the forward voltage drop of the diode 180, then during this initial cycle of operation only the resistor 160 will pass current to the plate 76 of the capacitor 24.

Starting with an initial potential $v_o$ on the plate 76 of the capacitor 24 during the first cycle of operation of the circuit 12, the potential on the plate 76, as a result of current received from the emitter of the transistor 72, increases from $v_o$ to $v_1$, as shown by the ramp portion in FIG. 2, in a time interval essentially equal to the period $t_1$ of the first cycle of the signal 20, as determined both by the capacitance value of the capacitor 24 and by the magnitude of the current at the emitter of the transistor 72. Since in any particular circuit 12 the capacitor 24 ordinarily has a fixed capacitance value, the only variable, given the conduction and non-conduction voltage $v_1$ and $v_o$, respectively, of the transistor 88, in determining the time required for the plate 76 of the capacitor 24 to charge from the potential $v_o$ to the potential $v_1$ is the magnitude of the current at the emitter of the transistor 72. Also during this time, the potential on the plate 108 of the capacitor 28 is brought to ground through the resistor 120.

When the potential on the plate 76 of the capacitor reaches $v_1$ volts the transistor 88, and therefore the transistors 92 and 104, conducts to render the transistor 72 nonconductive, to rapidly discharge the plate 76 of the capacitor 24 to the potential $v_o$, as shown by the negative going portion 128 of the signal 20 in FIG. 2, and to discharge the plate 108 of the capacitor 28 toward the negative potential on the conductor 84. Discharge of the plate 76 of the capacitor 24 to the potential $v_o$ marks the end of the period $t_1$ of the first cycle of the signal 20, which period began when current was initially applied to the plate 76 to increase the potential thereof from $v_o$ to $v_1$. The negative transition on the plate 108 of the capacitor 28 is, as previously stated, coupled to the plate 112 thereof and applied, through the diode 116, to the plate 36 of the capacitor 32 to transfer a quantum of energy thereto. This, of course, increases the negative potential on the plate 36 of the capacitor 32, so that during the next, or second, cycle of operation of the circuit 12 the transistor 72 will conduct a greater current than it conducted during the first cycle, to charge the plate 76 of the capacitor 24 from the potential $v_o$ to the potential $v_1$ in a time interval essentially equal to the period $t_2$ of the second cycle of the signal 20, which time interval is shorter than the time interval $t_1$. That is, the second cycle of the signal 20 will have a higher frequency than the first cycle thereof and, accordingly, each succeeding cycle of the signal 20 will have a higher frequency than the frequency of the cycle which preceded it.

The first cycle of operation of the circuit 12 generated a first cycle of the signal 20, across the output terminals 16, having a first frequency $f = 1/t_1$. Repetition of the cycle of operation, with the transfer of a quantum of energy from the capacitor 28 to the capacitor 32 at the end of each cycle of operation, generates successive cycles of the signal 20, each cycle of which has a shorter period, or higher frequency, than the cycle which preceded it, until a second higher and constant frequency value is reached. The potential on the plate 36 of the capacitor 32, and therefore at the base input of the transistor 64, becomes increasingly negative with each cycle of operation of the circuit 12, and in the circuit the second constant frequency is determined by the value of a Zener diode 200, connected between the base of the transistor 64 and the plate 40 of the capacitor 32, which limits the maximum negative potential which may be applied to the base of the transistor 64 by the op amp 56. When this maximum negative potential is reached, the Zener diode 200 conducts to maintain the input to the base of the transistor 64 at a constant negative potential, despite any increase in the current drawn by the output 60 of the op amp 56. This, of course, provides a constant input to the base of the transistor 72 from the transistor 64 during subsequent cycles of the circuit 12, and therefore subsequent cycles of the signal 20 have a constant frequency. Also at this point, since the conductivity of the transistor 72 is at its maximum and the potential at the input 156 of the op amp 56 is at a maximum negative potential, a diode 204, connected between the inputs 52 and 156 of the op amp 56, conducts to maintain an essentially equal potential between the inputs 52 and 156 as the potential at the input 52 attempts to become more negative with the continued transfer of quantums of energy from the capacitor 28 to the capacitor 32. It should be noted that as the frequency of the output signal 20 increases from its initial first frequency value to the second, higher and constant frequency value, successive ones of the diodes 180, 184, 188 and 192 conduct in response to an increasing negative potential at the emitter of the transistor 64, or at the input 156 of the op amp 56, to provide increasing currents through their associated resistors 164, 168, 172 and 176, respectively, for charging the plate 76 of the capacitor 24 from the potential $v_o$ to the potential $v_1$ at rates which increase with successive cycles of the signal 20.

It is to be noted that, with the configuration of the circuit of the invention, the quantums of energy which are transferred from the capacitor 28 to the capacitor 32, with each cycle of operation of the circuit 12, are equal in value to ensure uniform increase in frequency of each cycle of the signal 20 over the preceding cycle. This is accomplished by connecting a diode 208 between the plate 112 of the capacitor 28 and the input 156 of the op amp 56. Since the potential at the input 156 of the op amp 56 is equal to the potential at the input 52 thereof, and since the potential at the input 52 is equal to the potential on the plate 36 of the capacitor 32, the potential on the plate 112 of the capacitor 28 is maintained, through the diode 208, at the same potential as is on the plate 36 of the capacitor 32. The total voltage excursion on the plate 108 of the capacitor 28 is constant for each cycle of operation of the circuit 12, and with the potential on the plate 112 of the capacitor 28 maintained at the potential on the plate 36 of the capacitor 32, this total voltage excursion, as coupled from the plate 108 of the capacitor 28 to the plate 112 thereof, is transferred from the plate 112, through the diode 116, to the plate 36 of the capacitor 32 with each cycle of operation of the circuit 12. In other words, an equal quantum of energy is transferred from the capacitor 28 to the capacitor 32 with each cycle of operation of the oscillator circuit 12.

In the operation of the circuit 12, the transistor 72 is rendered nonconductive at the end of each cycle of the signal 20, during which time the plate 76 of the capacitor 24 is discharged from the potential $v_1$ to the potential $v_0$ through the transistors 88 and 92. This permits a broad range of frequency values, starting with a low initial frequency value and continuing to a high final frequency value to be obtained in the cycles of the output signal 20. This may be appreciated by considering that the frequency of any one cycle of the signal 20 is determined by the time required for the current, applied from the emitter of the transistor 72 to the plate 76 of the capacitor 24, to increase the potential on the plate 76 from the potential $v_0$ to $v_1$ . At very high frequencies, the current applied from the emitter of the transistor 72 must of necessity be large to charge the plate 76 of the capacitor 24 from the potential $v_0$ to $v_1$ during a very short interval. If during the discharge of the plate 76 the transistor 72 continued to conduct, then a point would be reached at some frequency value where the current provided from the emitter of the transistor 72 would be sufficient to maintain the base-emitter junction of the transistor 88 in a forward biased condition, thereby preventing the transistor 88 from ever becoming nonconductive to recycle the circuit 12. This frequency value would then be the upper frequency limit for the oscillator, and would be substantially less than the upper frequency limit obtainable where the transistor 72 is rendered nonconductive during the discharge of the plate 76 of the capacitor 24.

At very high frequencies, where the rate of change of potential with respect to time of the ramp portion 96 of the signal 20 becomes large, transistor capacitive coupling through the transistor 88, as applied to the base of the transistor 92, could cause premature triggering of the transistor 92, with the result that the circuit 12 would recycle prior to the plate 76 reaching the potential $v_1$. To prevent such premature triggering, two capacitors 212 and 216, two diodes 220 and 224, and a resistor 228 are connected in a current limiting arrangement with the collector of the transistor 88 and the base of the transistor 92 to apply a negative bias to the base of the transistor 92, at high frequencies, to prevent premature triggering of the transistor 92 due to the capacitive coupling of the signal 20 through the transistor 88.

During the operation of the circuit 12, the potential on a plate 236 of the capacitor 216, the other plate 240 of which is connected to the conductor 84, tends toward the negative potential on the conductor 84 through the resistor 228 and the base-emitter junction of the transistor 92. Each positive going ramp portion 96 of the signal 20, appearing on the plate 76 of the capacitor 24, is coupled through the capacitor 212 and the diode 224 to the negative potential on the conductor 84, and is prevented from being applied to the plate 236 of the capacitor 216 by the then reverse biased diode 220. Each negative going transition 128 of the signal 20, however, is coupled through the capacitor 212 and applied to the plate 236 of the capacitor 216 through the diode 220, the diode 224 at this time being reverse biased to prevent the passage of the negative going transition to the conductor 84. This charges negatively, with each cycle of operation of the circuit 12, the plate 236 of the capacitor 216 to a potential which is negative with respect to the potential on the conductor 84, and therefore negative with respect to the emitter of the transistor 92. The negative potential on the plate 236 of the capacitor 216 is applied, through the resistor 228, to the base of the transistor 92 and to the collector of the transistor 88. When the cycles of the signal 20 are at a low frequency, the rate of change of potential with respect to time of each ramp portion 96 of the signal 20 across the emitter and collector of the transistor 88 is sufficiently small so that there is no transistor capacitive coupling therethrough, and the potential on the plate 236 of the capacitor 216 has time to change to approximately the potential on the conductor 84, through the resistor 228, during each cycle of operation of the circuit 12. However, when the cycles of the signal 20 are at a high frequency, at which time the rate of change of potential with respect to time of each ramp portion 96 of the signal 20 is large, the positive transition of each ramp portion 96 is capacitively coupled to the base of the transistor 92 through the transistor 88. In this case the plate 236 of the capacitor 216 does not have sufficient time to discharge to the potential on the conductor 84, and the negative potential presented thereby to the base of the transistor 92 through the resistor 228 prevents triggering of the transistor 92 by a positive transition capacitively coupled through the transistor 88.

While one particular embodiment of the invention has been described in detail, it is understood that various other modifications and embodiments may be devised by one skilled in the art without departing from the spirit and scope of the invention. For example, while the circuit of the invention has been described as generating an output signal having cycles which increase in frequency directly in accordance with increasing energy levels on the capacitor 32 as quantums of energy are transferred thereto, it is within the contemplation of the invention that the capacitor 32 could initially have an energy level stored therein and that the cycles of the signal could increase in frequency inversely in accordance with the energy level on the capacitor 32 as quantums of energy are transferred therefrom. Similarly, it is within the contemplation of the invention to generate an output signal having a high initial frequency, and to decrease the frequency of successive cycles thereof in response to either an increasing, or decreasing, level of energy on the capacitor 2. Furthermore, while the circuit of the invention employs a plurality of resistors and diodes in a voltage-stepped arrangement for enabling each output cycle of the signal 20 to be at a frequency which is an essentially constant percentage of the frequency of the preceding cycle, a single resistor, such as the resistor 160, could be employed instead of the arrangement of voltage-stepped resistors and diodes as shown. Also, as the frequency of a cycle of the output signal is determined by the potential applied to the input 52 of the op amp 56, and since with a constant potential at the input 52 each succeeding cycle of the output signal 20 has a constant frequency, it is within the contemplation of one skilled in the art to employ the circuit of the invention as a broad band frequency generator, wherein the frequency of the output signal 20 therefrom is determined by a potential externally applied to the input 52 of the op amp 56, and wherein the capacitors 28 and 32 are not employed.

What is claimed is:

1. In an oscillator circuit for generating an output signal which has a frequency in accordance with the value of a control voltage;

a capacitor for cyclically receiving a charge for generating the output signal across the plates thereof;

a first semiconductor device having a conductivity in accordance with the value of the control voltage for charging the capacitor at a rate which is directly in accordance with the conductivity thereof;

a second semiconductor device, controlled by the accumulated charge on the capacitor to be rendered conductive when the accumulated charge is at a first level to discharge the capacitor to a second level of charge, and to be rendered nonconductive when the capacitor has discharged to the second level of charge, to cyclically generate across the capacitor successive cycles of the output signal having a frequency in accordance with the rate at which the first semiconductor device charges the capacitor from the second level of charge to the first level of charge, and a third semiconductor device, operable to render the first semiconductor device nonconductive upon conduction of the second semiconductor device, and to render the first semiconductor device conductive upon nonconduction of the second semiconductor device.

2. In a circuit for generating an output signal the successive cycles of which vary in frequency:

an electrical storage device for cyclically receiving a charge and for generating successive cycles of the output signal having a potential in accordance with the charge stored therein;

means for cyclically changing the charge on the electrical storage device at a controlled rate from a first predetermined level of charge to a second predetermined level of charge, and a control circuit, operative upon the charge on the electrical storage device reaching the second predetermined level of charge for changing the charge thereon to the first predetermined level of charge and for unidirectionally varying the rate at which the means for cyclically changing the charge changes the charge on the electrical storage device from the first to the second predetermined levels of charge.

3. In a circuit as set forth in claim 2, wherein:

the means for cyclically changing the charge on the electrical storage device includes a transistor, having a conductivity in accordance with the value of a control voltage, for applying a charge to the electrical storage device in accordance with the conductivity thereof, and the control circuit includes means, operative upon the charge on the electrical storage device reaching the second predetermined level of charge, for incrementally and unidirectionally varying the value of the control voltage.

4. In a circuit for generating an output signal the successive cycles of which vary in frequency:

a capacitor for cyclically receiving and accumulating a charge and for providing the output signal across the plates thereof;

an energy storage device;

means for changing the charge on the capacitor from a first level of charge to a second level of charge at a rate in accordance with the level of energy in the energy storage device;

means, rendered effective when the accumulated charge on the capacitor is at the second level of charge, for changing the charge on the capacitor to the first level of charge, for cyclically generating across the capacitor successive cycles of the output signal having a frequency in accordance with the level of energy on the energy storage device, and means, rendered effective with each cycle of the output signal when the accumulated charge on the capacitor is changed from the second level of charge to the first level of charge, for transferring a quantum of energy to the energy storage device so that successive cycles of the signal vary in frequency.

5. In an oscillator circuit for generating an output signal the successive cycles of which change in frequency directly in accordance with the value of a control voltage:

a capacitor for cyclically being charged from a first level of charge to a second level of charge for generating the output signal across the plates thereof;

a first semiconductor device, for being rendered conductive to a degree which is in accordance with the value of the control voltage, for charging the capacitor from the first level of charge to the second level of charge at a rate which is in accordance with the conductivity thereof;

a second semiconductor device, controlled by the accumulated charge on the capacitor, to be rendered conductive when the accumulated charge is at the second level to discharge the capacitor to the first level of charge, and to be rendered nonconductive when the capacitor has discharged to the first level of charge, to cyclically generate across the capacitor successive cycles of the output signal which have a frequency in accordance with the rate at which the first semiconductor device charges the capacitor from the first level of charge to the second level of charge, and means for unidirectionally changing the value of the control voltage with each successive cycle of the output signal to unidirectionally change the rate at which the first semiconductor device charges the capacitor from the first level of charge to the second level of charge with each successive cycle of the output signal, so that each successive cycle of the output signal unidirectionally varies in frequency with respect to the preceding cycle thereof.

6. In an oscillator circuit as set forth in claim 5, further including:

means for rendering the first semiconductor device nonconductive upon conduction of the second semiconductor device, and for rendering the first semiconductor device conductive upon nonconduction of the second semiconductor device.

7. In an oscillator circuit for generating an output signal the successive cycles of which increase in frequency:

a first capacitor for cyclically receiving a charge for generating the output signal across the plates thereof;

a second capacitor, for accumulating a charge on the plates thereof, and having a voltage across the plates thereof in accordance with the charge accumulated thereon;

a first transistor, having a conductivity in accordance with the value of the voltage across the plates of the second capacitor, for charging the first capacitor from a first predetermined level of charge to a second predetermined level of charge at a rate which is directly in accordance with the conductivity thereof;

a second transistor, controlled by the accumulated charge on the first capacitor to be rendered conductive when the accumulated charge is at the second predetermined level to discharge the first capacitor to the first predetermined level of charge, and to be rendered nonconductive when the first capacitor has been discharged to the first predetermined level of charge, for cyclically generating across the first capacitor successive cycles of the output signal having a frequency in accordance with the rate at which the first transistor charges the first capacitor from the first predetermined level of charge to the second predetermined level of charge, and means, operative each time the second transistor is rendered conductive, for transferring an incremental charge to the plates of the second capacitor to cyclically increase the accumulated charge on the second capacitor to increase the rate at which the first transistor charges the first capacitor.

8. In an oscillator circuit as set forth in claim 7, wherein the charge transferring means includes:

a third capacitor, for receiving a charge on the plates thereof when the second transistor is nonconductive, and means, operative when the second transistor is rendered conductive, for transferring the charge on the plates of the third capacitor to the plates of the second capacitor.

9. In an oscillator circuit as set forth in claim 8, further including:

means for rendering the first transistor nonconductive upon conduction of the second transistor, and for rendering the first transistor conductive upon nonconduction of the second transistor.

10. In an oscillator circuit as set forth in claim 9:

a plurality of diodes connected in series to exhibit a common polarity between first and second terminals;

a plurality of resistors, individual ones of which are connected between a third terminal and an individual one of the junctures between the serially connected diodes, and one of which is connected between the second terminal and the third terminal, and means for connecting the diodes and resistors in series with the first transistor to form a series circuit extending from the first capacitor, through the first transistor, and through the resistors and diodes from the first terminal to the third terminal, so that as the first transistor charges the first capacitor at an increasing rate, successive ones of the diodes conduct current through successive ones of the resistors as the forward voltage drop of the diodes is exceeded.

11. In an oscillator circuit having an increasing frequency output signal wherein a first transistor is cyclically rendered conductive at an increasing frequency for discharging a first capacitor from a first level of charge to a second level of charge, for generating the output signal across the plates thereof, and wherein the initiation of conduction of the first transistor is set by the time required to accumulate the first level of charge on the first capacitor, which charge is applied through a second transistor, the improvement which comprises:

a first control circuit including a second capacitor having a potential across the plates thereof for controlling the conductivity of the second transistor and therefore the rate at which the second transistor charges the first capacitor, and a second control circuit, cyclically rendered effective upon conduction of the first transistor for unidirectionally changing the potential across the second capacitor to render the second transistor more conductive to more rapidly charge the first capacitor upon interruption of conduction of the first transistor.

12. In an oscillator circuit as set forth in claim 11, further including:

means for rendering the second transistor nonconductive during the time that the first transistor is rendered conductive.

13. In an oscillator circuit for generating an output signal the successive cycles of which increase in frequency:

a first capacitor for cyclically receiving and accumulating a charge and for providing the output signal across the plates thereof;

a second capacitor, for accumulating a charge on the plates thereof;

a first transistor, having a conductivity directly in accordance with the level of charge on the second capacitor, for charging the first capacitor from a first level of charge to a second level of charge at a rate which is directly in accordance with the conductivity thereof;

means, operative upon each accumulation of the second level of charge on the first capacitor, for discharging the first capacitor to the first level of charge, to cyclically generate across the plates of the first capacitor successive cycles of the output signal, and means, responsive upon each operation of the first capacitor discharge means, for transferring an incremental charge to the second capacitor to increase the level of charge thereon to render the first transistor more conductive with each successive cycle of the output signal to more rapidly charge the first capacitor from the first level of charge to the second level of charge.

14. In an oscillator circuit as set forth in claim 13, wherein the first capacitor discharge means includes:

a second transistor, controlled by the accumulated charge on the first capacitor, to be rendered conductive when the charge is at the second level of charge for discharging the capacitor to the first level of charge, and to be rendered nonconductive when the capacitor has discharged to the first level of charge.

15. In an oscillator circuit as set forth in claim 14, wherein the means for transferring an incremental charge to the second capacitor includes:

a third capacitor, having first and second plates, for receiving and accumulating a charge while the first capacitor is charged from the first level to the second level, and means, operative upon conductive of the second transistor, for transferring the charge accumulated on the third capacitor to the second capacitor.

16. In an oscillator circuit as set forth in claim 15, wherein the charge transferring means includes:

a third transistor, controlled by conduction of the second transistor to be rendered conductive to discharge the first plate of the third capacitor to rapidly change the voltage thereon, whereby the voltage transition on the first plate of the third capacitor is capacitively coupled to the second plate thereof, and means for applying the voltage transition on the second plate of the third capacitor to the second capacitor to transfer an incremental charge thereto.

17. In an oscillator circuit as set forth in claim 16, further including:

means for rendering the first transistor nonconductive upon conduction of the second transistor, and for rendering the first transistor conductive upon nonconduction of the second transistor.

18. In an oscillator circuit for generating an output signal the successive cycles of which increase in frequency:

a first transistor, having a base, an emitter and a collector circuit;

a second transistor, having a base, an emitter and a collector circuit, connected with its emitter-collector circuit in series with the emitter-collector circuit of the first transistor;

a first capacitor, for generating the output signal across the plates thereof, connected to the juncture between the first and the second transistors for cyclically being charged by the first transistor and discharged by the second transistor;

means for applying a potential to the base of the first transistor to control the conductivity thereof to charge the first capacitor, at a rate in accordance with the conductivity thereof, from a first level of charge to a second level of charge;

means for controlling the potential at the base of the second transistor for maintaining the second transistor nonconductive while the first capacitor is charging from the first to the second level of charge, for rendering the second transistor conductive when the first capacitor is at the second level of charge to discharge the first capacitor toward the first level of charge, and for rendering the second transistor nonconductive when the first capacitor reaches the first level of charge so that the first transistor again charges the first capacitor from the first to the second levels of charge, and means, responsive upon each conduction of the second transistor, for unidirectionally changing the potential at the base of the first transistor for increasing the conductivity of the first transistor to charge the first capacitor from the first to the second level of charge at an increased rate.

19. In an oscillator circuit as set forth in claim 18, wherein the means for applying a potential to the base of the first transistor includes:

a second capacitor, for accumulating a charge on the plates thereof, and having a potential across the plates thereof in accordance with the charge accumulated thereon, and means for applying a potential to the base of the first transistor which is in accordance with the potential across the plates of the second capacitor, and wherein the means for unidirectionally changing the potential at the base of the first transistor includes:

a third capacitor, having first and second plates, for receiving and accumulating a charge on the first plate thereof while the first capacitor is charged from the first to the second level of charge;

a third transistor, having a base, an emitter and a collector circuit, connected at its emitter-collector circuit to the first plate of the third capacitor for rapidly changing the charge thereon, and therefore the potential thereon, upon conduction thereof, whereby the potential transition on the first plate of the third capacitor is capacitively coupled to the second plate thereof;

means for rendering the third transistor conductive upon conduction of the second transistor and for rendering the third transistor nonconductive upon nonconduction of the second transistor, and means for applying the potential transition on the second plate of the third capacitor to the second capacitor for changing the charge on the plates thereof, and therefore the potential across the plates thereof, whereby the potential at the base of the first transistor is changed.

20. In an oscillator circuit as set forth in claim 19, further including:

means for rendering the first transistor nonconductive upon conduction of the second transistor and for rendering the first transistor conductive upon nonconduction of the second transistor.

* * * * *